(12) United States Patent
Katsuta

(10) Patent No.: US 11,342,360 B2
(45) Date of Patent: May 24, 2022

(54) ARRAY SUBSTRATE AND DISPLAY DEVICE

(71) Applicant: Japan Display Inc., Minato-ku (JP)

(72) Inventor: Tadayoshi Katsuta, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/928,185

(22) Filed: Jul. 14, 2020

(65) Prior Publication Data

US 2021/0020661 A1    Jan. 21, 2021

(30) Foreign Application Priority Data

Jul. 19, 2019    (JP) .............................. JP2019-134057

(51) Int. Cl.
*H01L 27/12* (2006.01)
*G02F 1/1362* (2006.01)
*H01L 29/786* (2006.01)

(52) U.S. Cl.
CPC ...... *H01L 27/124* (2013.01); *G02F 1/136286* (2013.01); *G02F 2201/121* (2013.01); *G02F 2201/123* (2013.01); *H01L 29/78624* (2013.01); *H01L 29/78645* (2013.01); *H01L 29/78696* (2013.01)

(58) Field of Classification Search
CPC ............. G02F 1/1685; G02F 1/136286; G02F 1/1676; G02F 1/16766; G02F 2201/121; G02F 2201/123; G02F 1/167; H01L 29/78624; H01L 29/78645; H01L 29/78696; H01L 27/124
See application file for complete search history.

(56) References Cited

U.S. PATENT DOCUMENTS

| 9,941,303 | B1* | 4/2018 | Zhou ................. G02F 1/136227 |
| 2004/0135146 | A1* | 7/2004 | Yamazaki ........... H01L 27/1222 257/59 |
| 2010/0232004 | A1* | 9/2010 | Hiroshima ............ H01L 27/124 359/259 |
| 2015/0168799 | A1* | 6/2015 | Emori .................... G01M 11/30 324/750.01 |
| 2017/0213505 | A1* | 7/2017 | Yamazaki ........... H01L 27/3262 |

FOREIGN PATENT DOCUMENTS

JP    2011-221125 A    11/2011

* cited by examiner

*Primary Examiner* — Michael H Caley
*Assistant Examiner* — Jonathan Y Jung
(74) *Attorney, Agent, or Firm* — Oblon, McClelland, Maier & Neustadt, L.L.P.

(57) ABSTRACT

According to an aspect, an array substrate includes a first scan line, a second scan line, and a signal line. A semiconductor film has a coupling portion coupling one end of a first linear portion to one end of a second linear portion. Another end of the first linear portion of the semiconductor film and another end of the second linear portion of the semiconductor film are coupled to the signal line. In a plan view, the semiconductor film is disposed between the first scan line and the second scan line, the first linear portion intersects two first gate electrodes, and the second linear portion intersects two second gate electrodes.

12 Claims, 14 Drawing Sheets

US 11,342,360 B2

ARRAY SUBSTRATE AND DISPLAY DEVICE

CROSS-REFERENCE TO RELATED APPLICATIONS

This application claims priority from Japanese Application No. 2019-134057, filed on Jul. 19, 2019, the contents of which are incorporated by reference herein in its entirety.

BACKGROUND

1. Technical Field

The present disclosure relates to an array substrate on which switching elements to drive a display layer are formed.

2. Description of the Related Art

Recent years have seen a growing demand for display devices for use in, for example, mobile electronic apparatuses, such as mobile phones and electronic paper. For example, an electrophoretic display (EPD) used in the electronic paper has a memory property to maintain a potential at the time of rewriting an image. After the EPD performs the rewriting once for each frame, the potential at the time of the rewriting is maintained until the EPD performs the rewriting for the next frame. As a result, the EPD can perform low power consumption driving. For example, Japanese Patent Application Laid-open Publication No. 2011-221125 (JP-A-2011-221125) discloses a technique to achieve the low power consumption by configuring pixel transistors of the EPD in a complementary metal-oxide semiconductor (CMOS) configuration obtained by combining p-channel transistors with n-channel transistors.

In the technique of JP-A-2011-221125, the number of transistors, the number of scan lines, and the number of signal lines for each pixel are large. Therefore, the area per pixel is difficult to be reduced.

For the foregoing reasons, there is a need for an array substrate and a display device capable of achieving a higher definition.

SUMMARY

According to an aspect, an array substrate includes: a first scan line extending in a first direction; a second scan line extending in the first direction; two first gate electrodes coupled to the first scan line and projecting in a second direction intersecting the first direction from the first scan line toward the second scan line; two second gate electrodes coupled to the second scan line and projecting in the second direction from the second scan line toward the first scan line; a signal line intersecting the first scan line and the second scan line in a plan view; and a semiconductor film having a first linear portion extending in the first direction, a second linear portion extending in the first direction, and a coupling portion coupling one end of the first linear portion to one end of the second linear portion, with another end of the first linear portion and another end of the second linear portion being coupled to the signal line. In the plan view, the semiconductor film is disposed between the first scan line and the second scan line, the first linear portion intersects the two first gate electrodes, and the second linear portion intersects the two second gate electrodes.

According to another aspect, a display device includes: an array substrate; a counter substrate; and a display layer located between the array substrate and the counter substrate. The display layer is an electrophoretic layer. The array substrate includes: a first scan line extending in a first direction; a second scan line extending in the first direction; two first gate electrodes coupled to the first scan line and projecting in a second direction intersecting the first direction from the first scan line toward the second scan line; two second gate electrodes coupled to the second scan line and projecting in the second direction from the second scan line toward the first scan line; a signal line intersecting the first scan line and the second scan line in a plan view; and a semiconductor film having a first linear portion extending in the first direction, a second linear portion extending in the first direction, and a coupling portion coupling one end of the first linear portion to one end of the second linear portion, with another end of the first linear portion and another end of the second linear portion being coupled to the signal line. In the plan view, the semiconductor film is disposed between the first scan line and the second scan line, the first linear portion intersects the two first gate electrodes, and the second linear portion intersects the two second gate electrodes.

DETAILED DESCRIPTION

Figure 1:
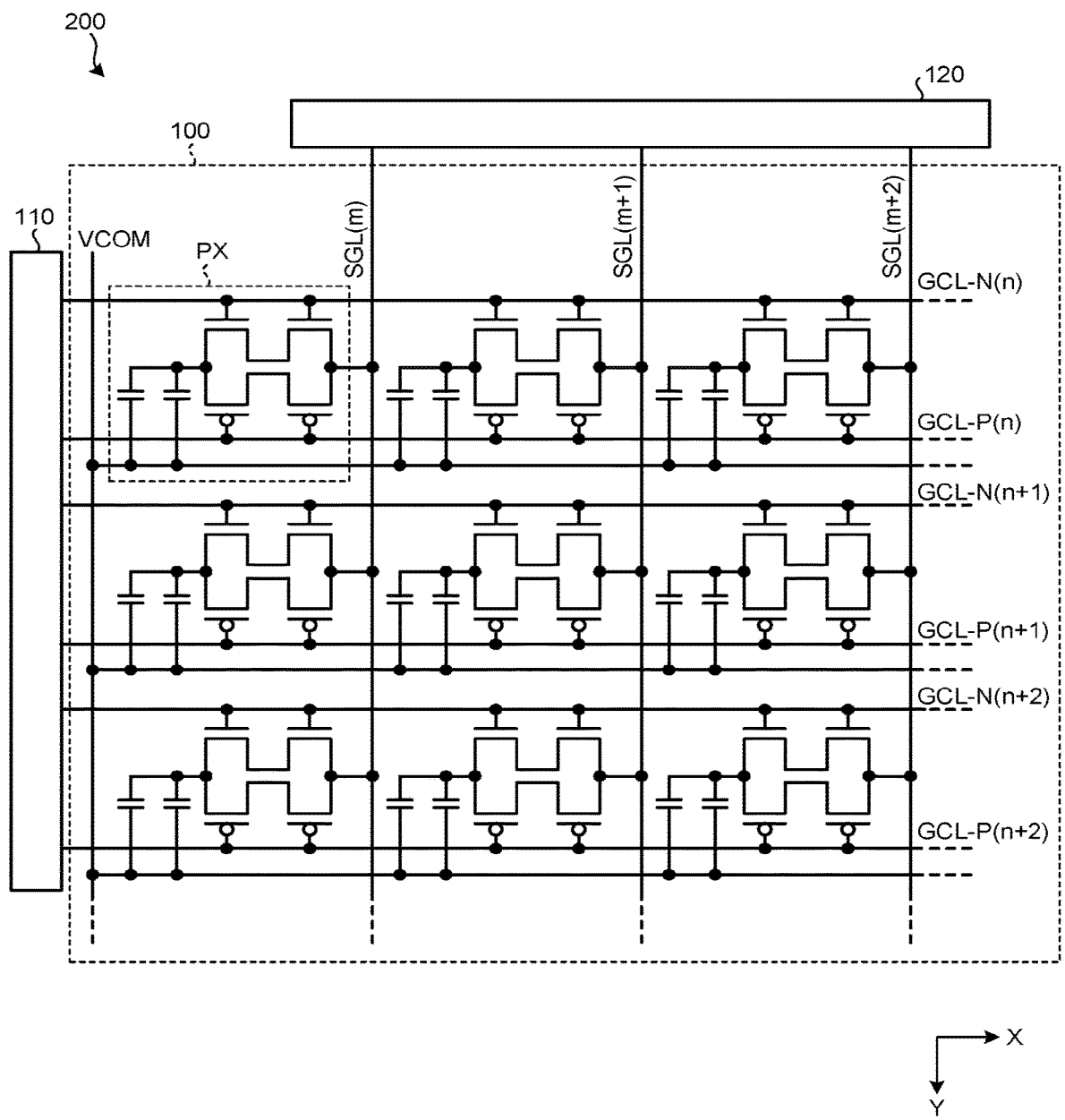
FIG. 1 is a block diagram illustrating a display device according to a first embodiment of the present disclosure.

The following describes modes (embodiments) for carrying out the present disclosure in detail with reference to the drawings. The present disclosure is not limited to the description of the embodiments to be given below. Components to be described below include those easily conceivable by those skilled in the art or those substantially identical thereto. Furthermore, the components to be described below can be combined as appropriate. The disclosure is merely an example, and the present disclosure naturally encompasses appropriate modifications easily conceivable by those skilled in the art while maintaining the gist of the invention. To further clarify the description, widths, thicknesses, shapes, and the like of various parts will be schematically illustrated in the drawings as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate. In this disclosure, when an element A is described as being "on" another element B, the element A can be directly on the other element B, or there can be one or more elements between the element A and the other element B.

First Embodiment

Figure 2:
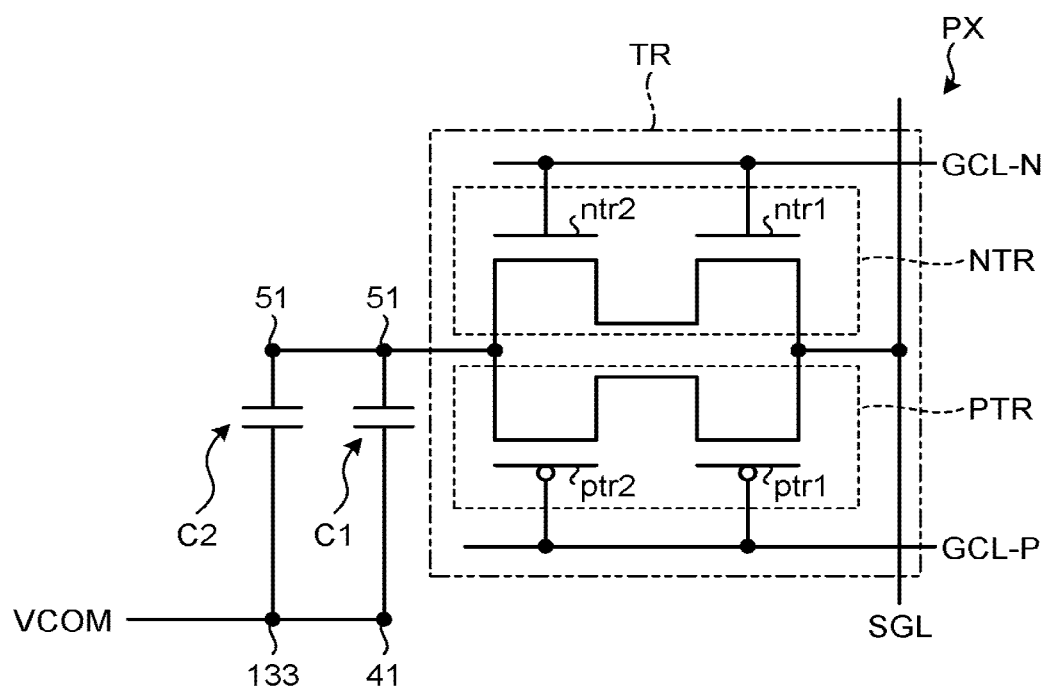
FIG. 2 is a circuit diagram illustrating one pixel on an array substrate according to the first embodiment.

FIG. 1 is a block diagram illustrating a display device according to a first embodiment of the present disclosure. FIG. 2 is a circuit diagram illustrating one pixel on an array substrate according to the first embodiment. A display device 200 according to the first embodiment is mounted on, for example, an electronic apparatus, which is not illustrated. A power supply voltage is applied from a power supply circuit of the electronic apparatus to the display device 200, which performs image display based on a signal output from a control circuit that is a host processor of the electronic apparatus. Examples of the display device 200 include, but are not limited to, an electrophoretic display (EPD) including an electrophoretic layer 160 (refer to FIG. 10 to be discussed later). As illustrated in FIG. 1, the display device 200 includes an array substrate 100, a gate drive circuit 110 coupled to the array substrate 100, and a source drive circuit 120 coupled to the array substrate 100.

As illustrated in FIG. 1, the array substrate 100 includes a plurality of pixels PX, a plurality of first scan lines GCL-N(n), GCL-N(n+1), GCL-N(n+2), a plurality of second scan lines GCL-P(n), GCL-P(n+1), GCL-P(n+2), ..., and a plurality of signal lines SGL(m), SGL(m+1), SGL(m+2), ..., where n and m are integers equal to or larger than 1. In the following description, the first scan lines GCL-N(n), GCL-N(n+1), GCL-N(n+2), ... will each be called a first scan line GCL-N when they need not be distinguished from one another. In the same manner, the second scan lines GCL-P(n), GCL-P(n+1), GCL-P(n+2), will each be called a second scan line GCL-P when they need not be distinguished from one another. The signal lines SGL(m), SGL(m+1), SGL(m+2), ... will each be called a signal line SGL when they need not be distinguished from one another.

In FIG. 1, an X-direction denotes a first direction, and a Y-direction denotes a second direction intersecting the first direction. The pixels PX are arranged side by side in the X-direction and the Y-direction intersecting the X-direction, and are arranged in a two-dimensional matrix having a row-column configuration. The first scan lines GCL-N extend in the X-direction, and are arranged side by side in the Y-direction. The second scan lines GCL-P also extend in the X-direction, and are arranged side by side in the Y-direction. The first scan lines GCL-N and the second scan lines GCL-P are alternately arranged side by side in the Y-direction. For example, the first scan lines GCL-N and the second scan lines GCL-P are arranged side by side in the Y-direction in the order of the first scan line GCL-N(n), the second scan line GCL-P(n), the first scan line GCL-N(n+1), the second scan line GCL-P(n+1), .... The signal lines SGL extend in the Y-direction, and are arranged side by side in the X-direction. With this arrangement, each of the signal lines SGL intersects the first scan lines GCL-N and the second scan lines GCL-P in a plan view. In the present example, the signal lines SGL are orthogonal to the scan lines GCL. The plan view refers to a view from a direction normal to one surface 1a of a base material 1 of the array substrate 100 (refer to FIG. 7).

Each of the first scan lines GCL-N and the second scan lines GCL-P is coupled to the gate drive circuit 110. Each of the signal lines SGL is coupled to the source drive circuit 120.

The gate drive circuit 110 generates a first gate drive signal and a second gate drive signal based on the signal output from the above-described control circuit. The gate drive circuit 110 supplies the first gate drive signal to the first scan lines GCL-N, and supplies the second gate drive signal to the second scan lines GCL-P. The source drive circuit 120 generates a source drive signal based on the signal output from the above-described control circuit. The source drive circuit 120 supplies the source drive signal to the signal lines SGL.

Figure 10:
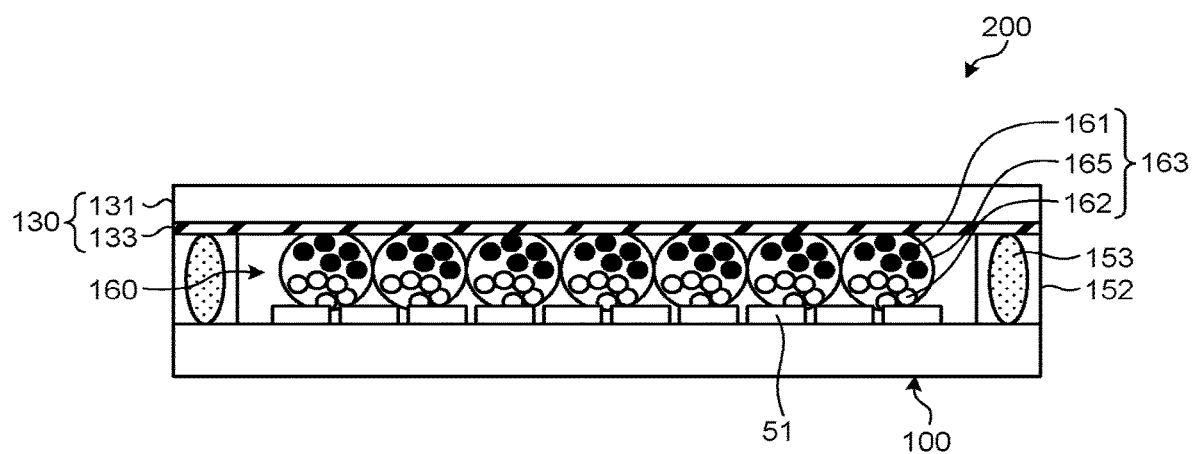
FIG. 10 is a sectional view illustrating the display device according to the first embodiment.

The gate drive circuit 110 and the source drive circuit 120 may be provided on the array substrate 100, or may be provided on a counter substrate 130 (refer to FIG. 10 to be discussed later). For example, the gate drive circuit 110 and the source drive circuit 120 may be disposed on the base material 1 of the array substrate 100. The gate drive circuit 110 and the source drive circuit 120 may be included in an integrated circuit (IC) mounted on the array substrate 100 or on another circuit substrate (such as a flexible substrate) coupled to the array substrate 100.

As illustrated in FIG. 2, each of the pixels PX of the array substrate 100 includes a pixel transistor TR. For example, the pixel transistor TR has a complementary metal-oxide semiconductor (MOS) (CMOS) configuration, and includes an n-channel metal-oxide semiconductor (NMOS) transistor NTR and a p-channel metal-oxide semiconductor (PMOS) transistor PTR. Each of the NMOS transistor NTR and the PMOS transistor PTR is, for example, a bottom-gate transistor.

The NMOS transistor NTR is coupled in parallel to the PMOS transistor PTR. The source of the NMOS transistor NTR and the source of the PMOS transistor PTR are coupled to the signal line SGL. The drain of the NMOS transistor NTR is coupled to the drain of the PMOS transistor PTR.

The NMOS transistor NTR includes a first NMOS transistor ntr1 and a second NMOS transistor ntr2. The first NMOS transistor ntr1 is coupled in series to the second NMOS transistor ntr2. The PMOS transistor PTR includes a first PMOS transistor ptr1 and a second PMOS transistor ptr2. The first PMOS transistor ptr1 is coupled in series to the second PMOS transistor ptr2.

The gate of the NMOS transistor NTR includes a first gate electrode GCL-Na of the first NMOS transistor ntr1 and a first gate electrode GCL-Nb of the second NMOS transistor ntr2. The gate of the NMOS transistor NTR is coupled to the first scan line GCL-N. The source of the NMOS transistor NTR is coupled to the signal line SGL. The drain of the NMOS transistor NTR is coupled to a pixel electrode 51. The source of the NMOS transistor NTR is supplied with the source drive signal (video signal) from the signal line SGL. The gate of the NMOS transistor NTR is supplied with the first gate drive signal from the first scan line GCL-N. When the voltage of the first gate drive signal supplied to the NMOS transistor NTR increases to a predetermined value or higher, the NMOS transistor NTR is turned on. As a result, the source drive signal (video signal) is supplied from the signal line SGL to the pixel electrode 51 through the NMOS transistor NTR.

The gate of the PMOS transistor PTR includes a second gate electrode GCL-Pa of the first PMOS transistor ptr1 and a second gate electrode GCL-Pb of the second PMOS transistor ptr2. The gate of the PMOS transistor PTR is coupled to the second scan line GCL-P. The source of the PMOS transistor PTR is coupled to the signal line SGL. The drain of the PMOS transistor PTR is coupled to the pixel electrode 51. The source of the PMOS transistor PTR is supplied with the source drive signal (video signal) from the signal line SGL. The gate of the PMOS transistor PTR is supplied with the second gate drive signal from the second scan line GCL-P. When the voltage of the second gate drive signal supplied to the PMOS transistor PTR decreases to a predetermined value or lower, the PMOS transistor PTR is turned on. As a result, the source drive signal (video signal) is supplied from the signal line SGL to the pixel electrode 51 through the PMOS transistor PTR.

Each of the pixels PX of the array substrate 100 has first retention capacitance C1 and second retention capacitance C2. The first retention capacitance C1 is generated between the pixel electrode 51 and a common electrode 41. The second retention capacitance C2 is generated between a counter electrode 133 of the counter substrate 130 and the pixel electrode 51. The pixel electrode 51 is supplied with the source drive signal (video signal) from the signal line SGL through the pixel transistor TR. The common electrode 41 and the counter electrode 133 are supplied with a common potential VCOM. The potential of the source drive signal (video signal) supplied to the pixel electrode 51 is retained by the first retention capacitance C1 and the second retention capacitance C2.

Figure 3:
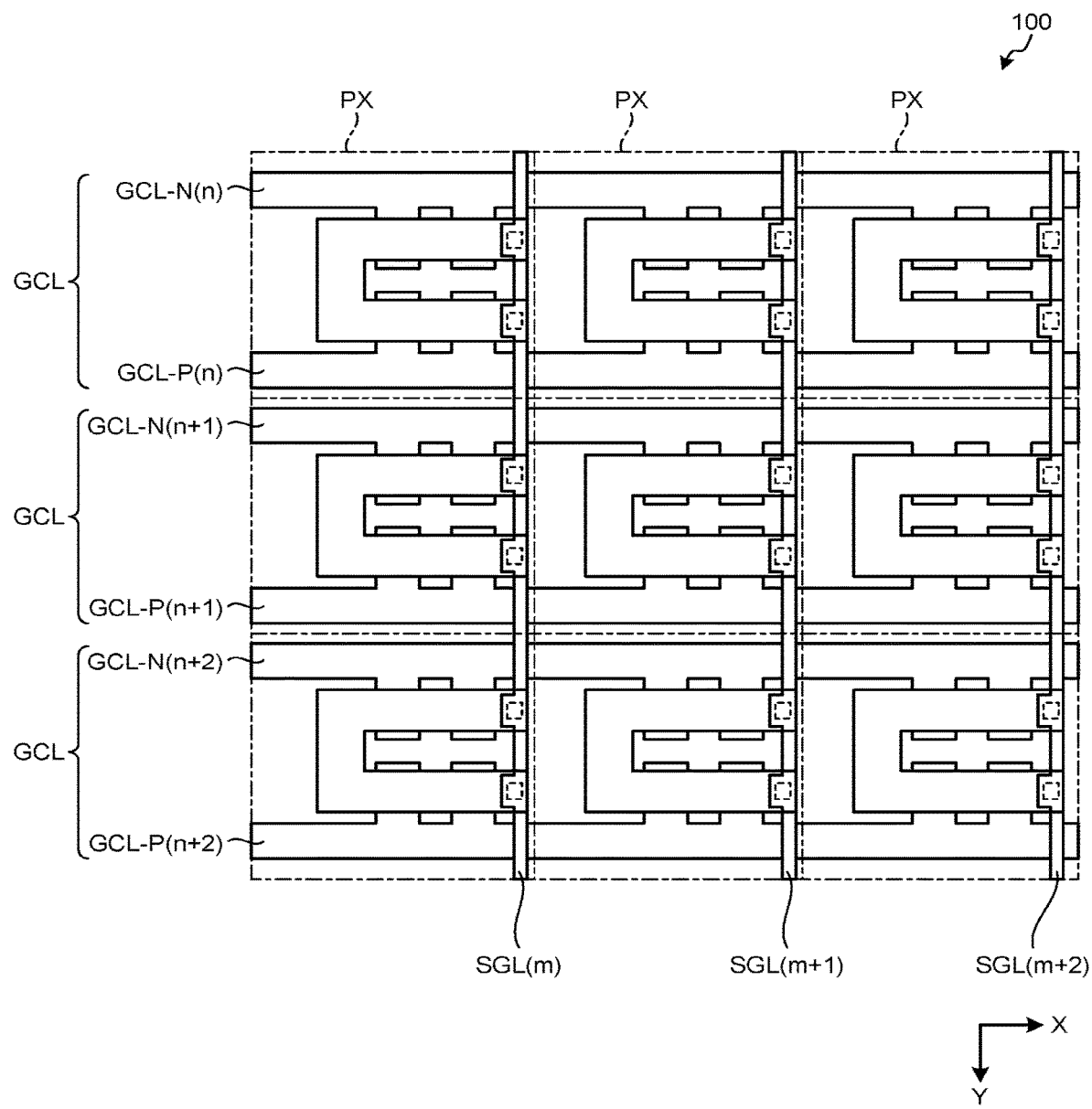
FIG. 3 is a plan view illustrating an arrangement example of a plurality of pixels on the array substrate according to the first embodiment.
Figure 4:
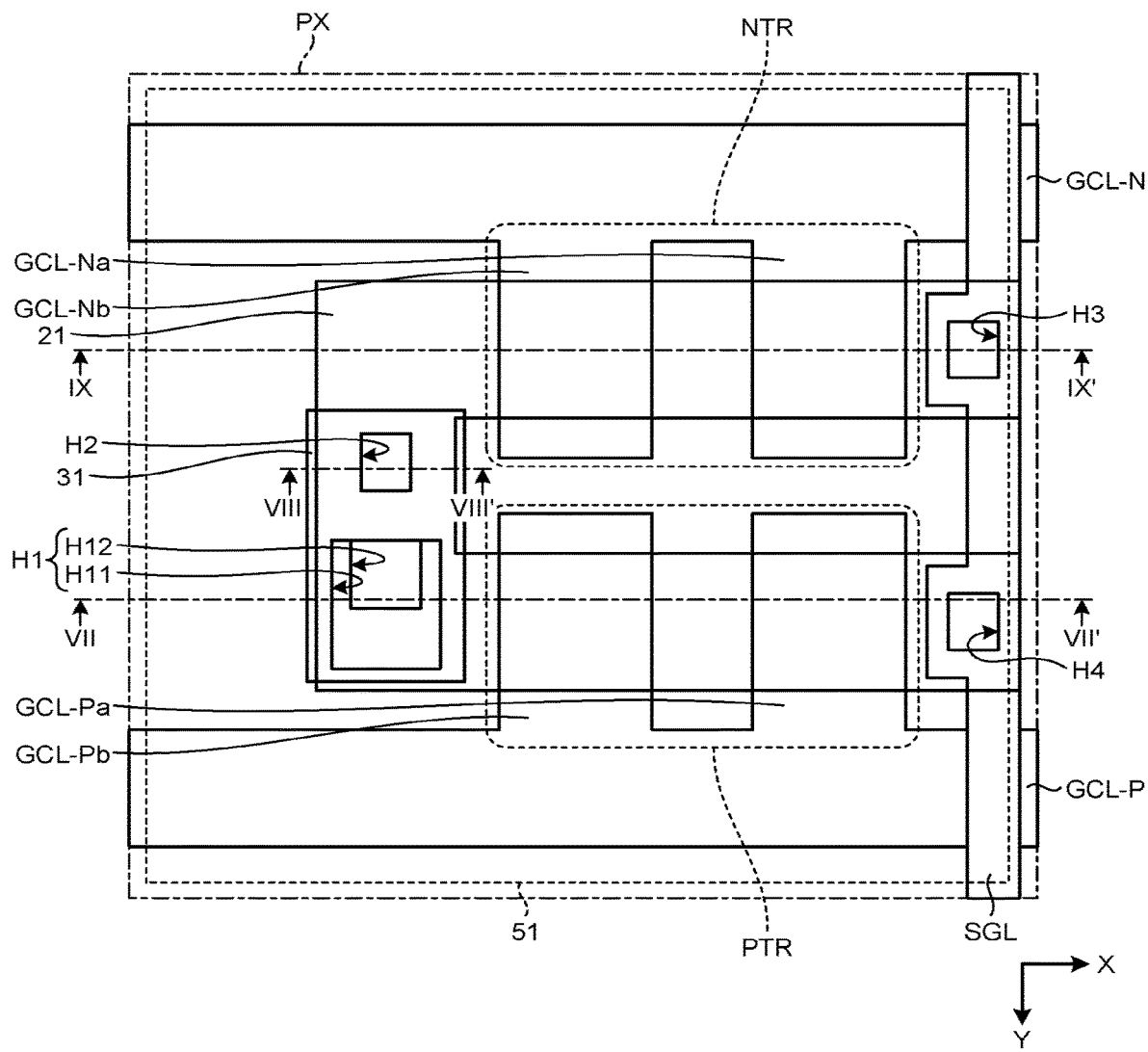
FIG. 4 is a plan view illustrating one of the pixels of the array substrate according to the first embodiment.
Figure 5:
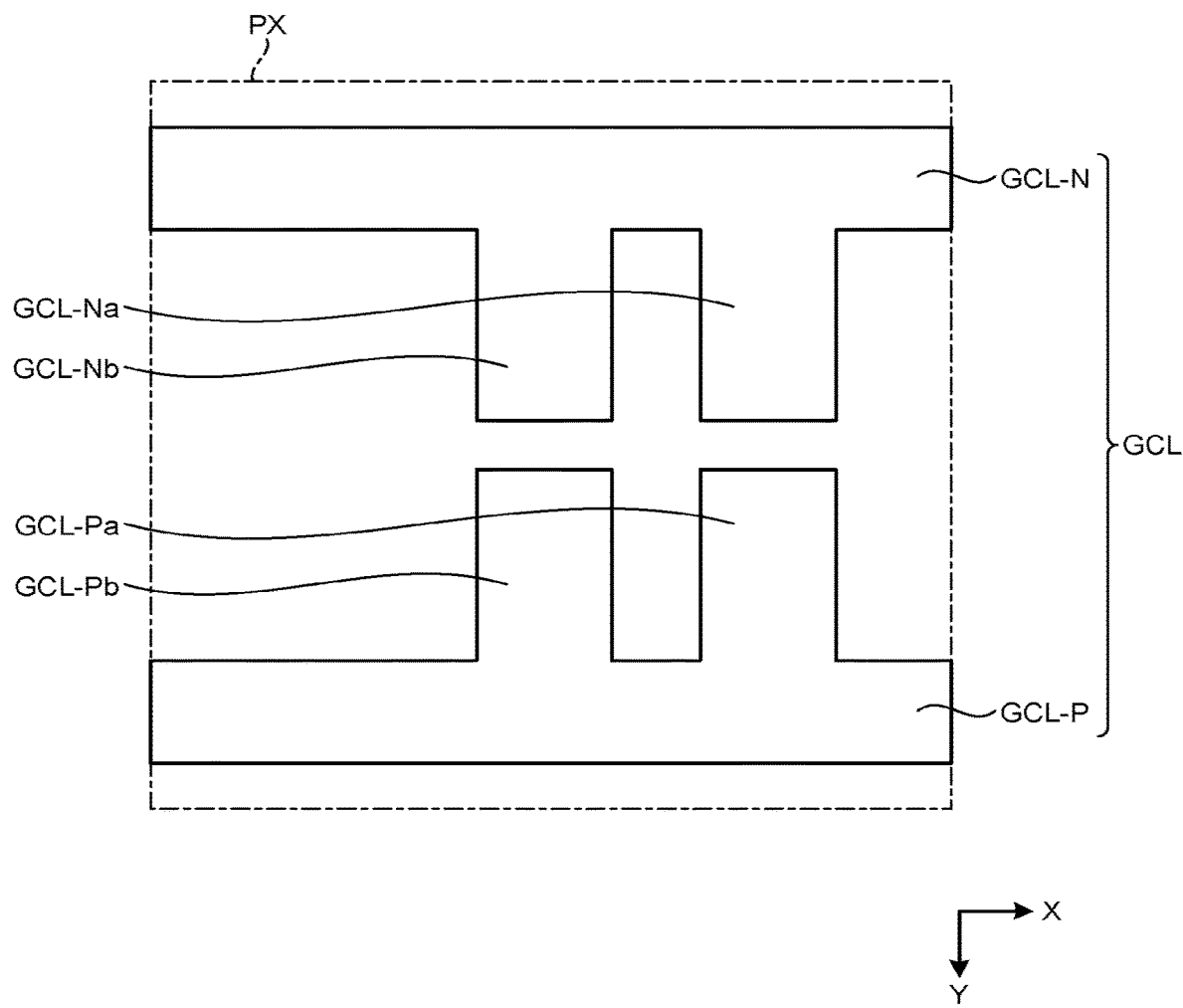
FIG. 5 is a plan view illustrating scan lines in one of the pixels of the array substrate according to the first embodiment.
Figure 6:
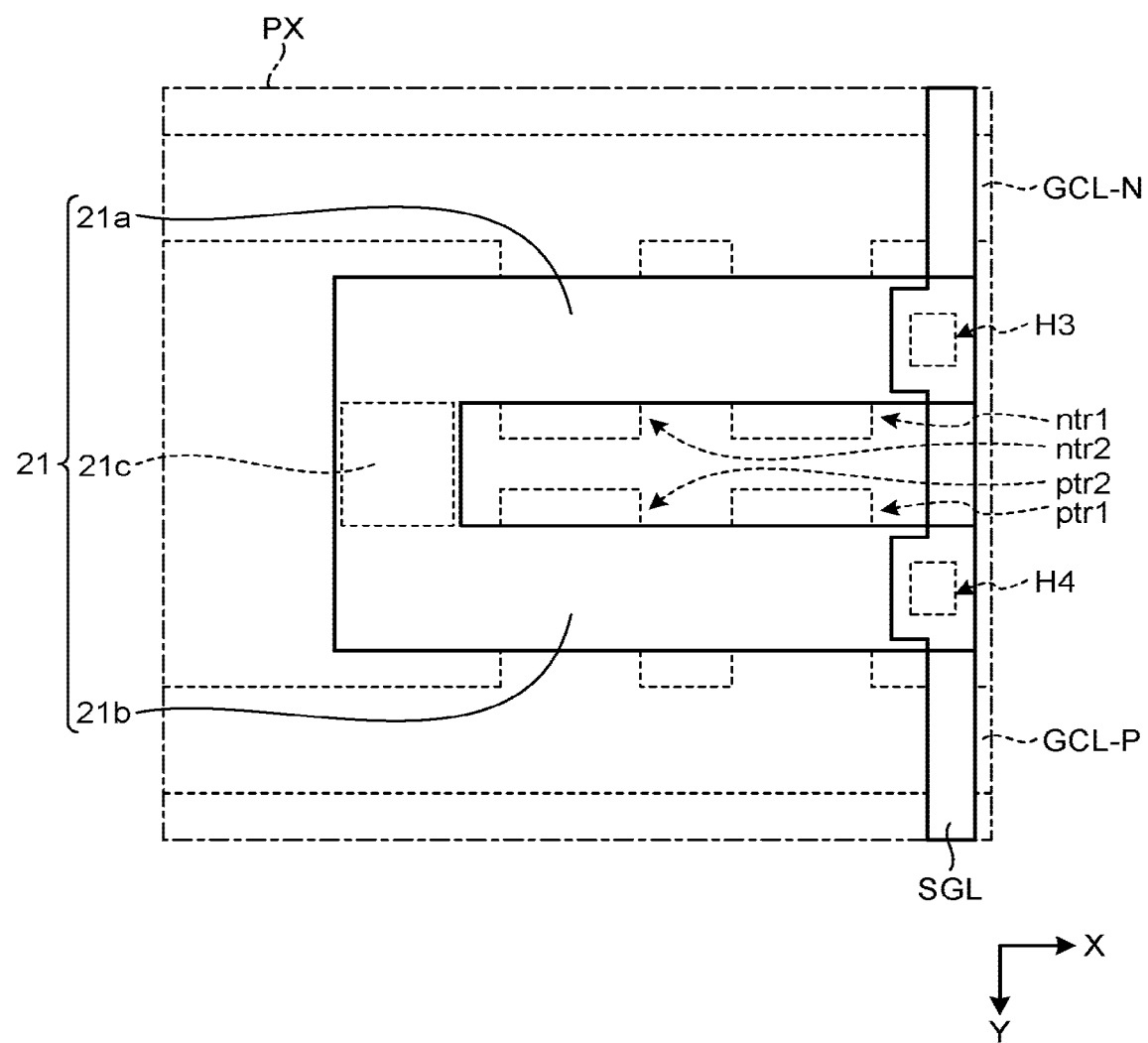
FIG. 6 is a plan view illustrating a semiconductor film in one of the pixels of the array substrate according to the first embodiment.
Figure 7:
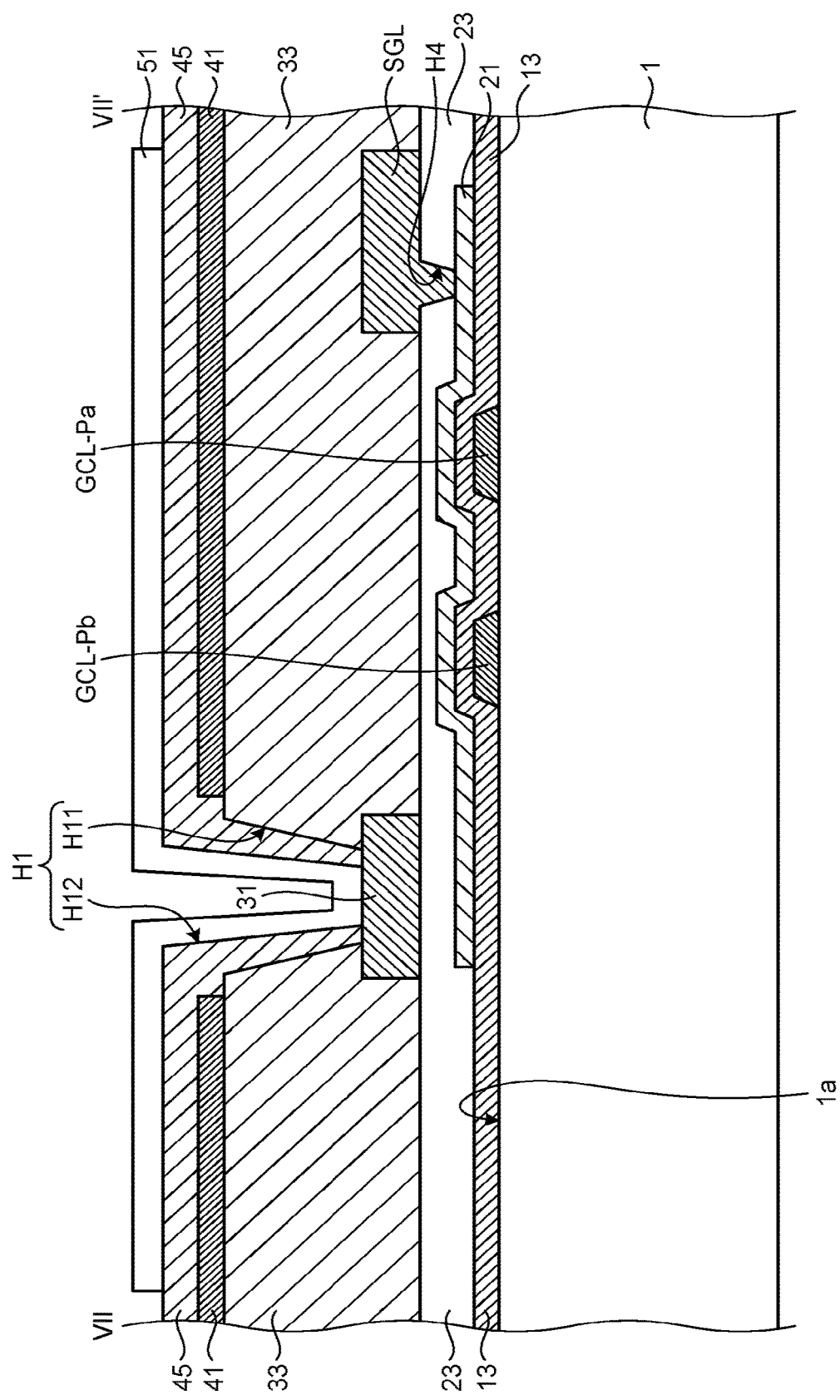
FIG. 7 is a sectional view along line VII-VII' illustrated in FIG. 4.
Figure 8:
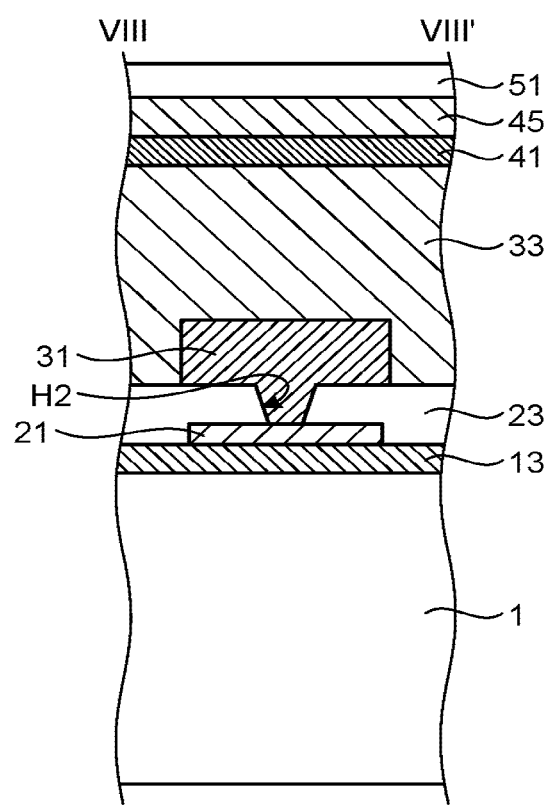
FIG. 8 is a sectional view along line VIII-VIII' illustrated in FIG. 4.
Figure 9:
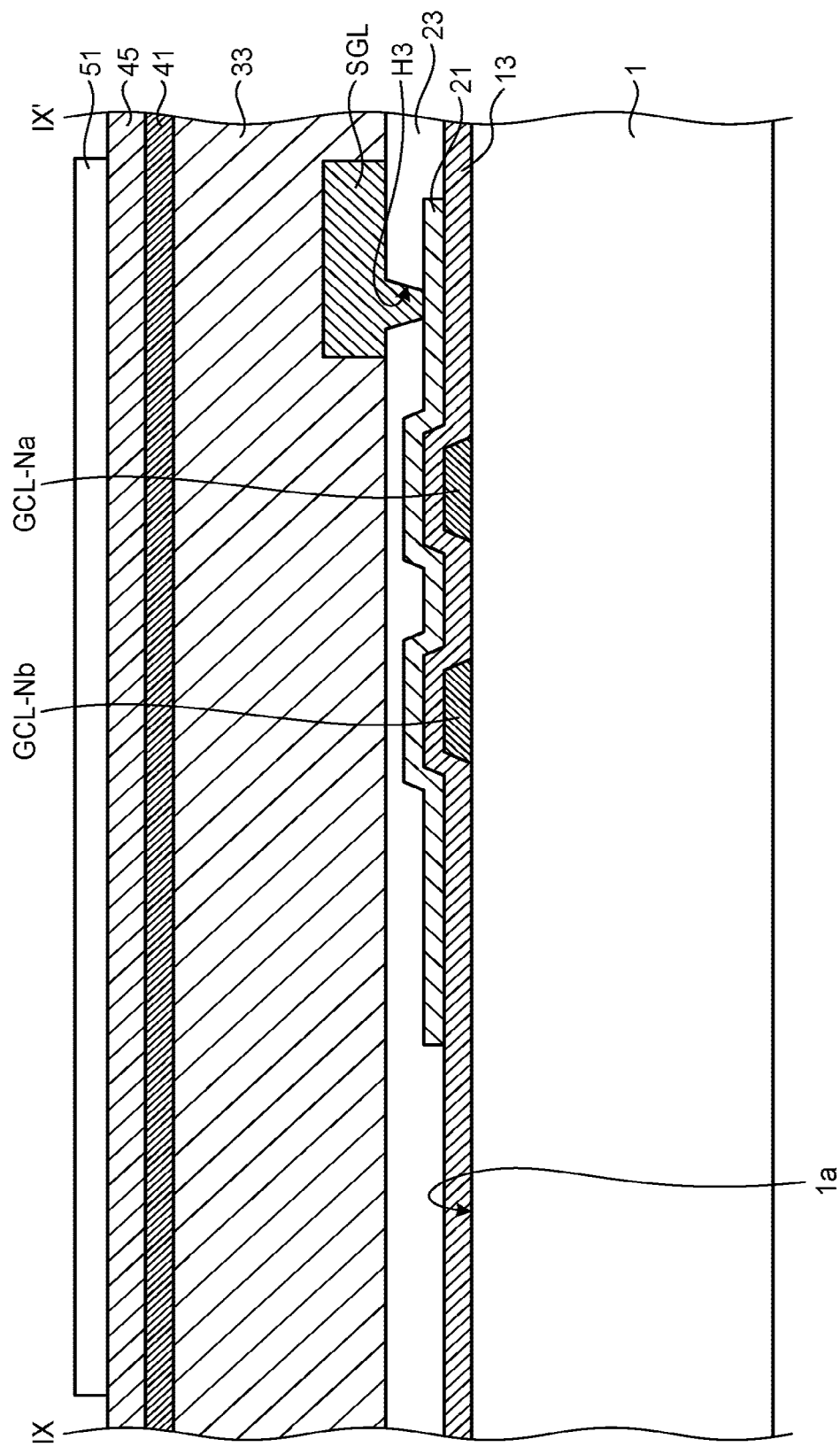
FIG. 9 is a sectional view along line IX-IX' illustrated in FIG. 4.

The following describes the structure of the array substrate 100. FIG. 3 is a plan view illustrating an arrangement example of the pixels on the array substrate according to the first embodiment. FIG. 4 is a plan view illustrating one of the pixels of the array substrate according to the first embodiment. FIG. 5 is a plan view illustrating the scan lines in one of the pixels of the array substrate according to the first embodiment. FIG. 6 is a plan view illustrating a semiconductor film in one of the pixels of the array substrate according to the first embodiment. FIG. 7 is a sectional view along line VII-VII' illustrated in FIG. 4. FIG. 8 is a sectional view along line VIII-VIII' illustrated in FIG. 4. FIG. 9 is a sectional view along line IX-IX' illustrated in FIG. 4.

As illustrated in FIGS. 3, 4, and 7, the array substrate 100 includes the base material 1, the scan lines GCL provided on the one surface 1a of the base material 1, and an insulating film 13 provided on the one surface 1a of the base material 1. The base material 1 is an insulating substrate of glass or a flexible resin.

Each of the scan lines GCL includes the first scan line GCL-N and the second scan line GCL-P adjacent to the first scan line GCL-N in the Y-direction. The first scan line GCL-N and the second scan line GCL-P are formed of a material containing molybdenum.

The insulating film 13 covers the first scan line GCL-N and the second scan line GCL-P. The insulating film 13 is an inorganic insulating film, such as a silicon oxide film or a silicon nitride film. For example, the insulating film 13 may be a multilayered structure film obtained by stacking the silicon oxide film and the silicon nitride film in this order from the base material 1 side.

As illustrated in FIG. 5, the first gate electrode GCL-Na and the first gate electrode GCL-Nb are coupled to the first scan line GCL-N. The first gate electrode GCL-Na projects in the Y-direction from the first scan line GCL-N. One end of the first gate electrode GCL-Na is coupled to the first scan line GCL-N, and the other end thereof is not coupled to any part. The first gate electrode GCL-Nb projects in the Y-direction from the first scan line GCL-N. One end of the first gate electrode GCL-Nb is coupled to the first scan line GCL-N, and the other end thereof is not coupled to any part.

As illustrated in FIG. 5, the second gate electrode GCL-Pa and the second gate electrode GCL-Pb are coupled to the second scan line GCL-P. The second gate electrode GCL-Pa projects in the Y-direction from the second scan line GCL-P. One end of the second gate electrode GCL-Pa is coupled to the second scan line GCL-P, and the other end thereof is not coupled to any part. The second gate electrode GCL-Pb projects in the Y-direction from the second scan line GCL-P. One end of the second gate electrode GCL-Pb is coupled to the second scan line GCL-P, and the other end thereof is not coupled to any part.

As illustrated in FIGS. 7, 8, and 9, the array substrate 100 includes a semiconductor film 21 provided on the insulating film 13 and an interlayer insulating film 23 provided on the insulating film 13. The semiconductor film 21 is a polysilicon film. The semiconductor film 21 is not limited to the polysilicon film, and may be an amorphous film or an oxide semiconductor film.

As illustrated in FIG. 6, the semiconductor film 21 is disposed between the first scan line GCL-N and the second scan line GCL-P. The semiconductor film 21 is U-shaped. The semiconductor film 21 has a first linear portion 21a extending in the X-direction, a second linear portion 21b extending in the X-direction, and a coupling portion 21c coupling one end of the first linear portion 21a to one end of the second linear portion 21b. The first linear portion 21a of the semiconductor film 21 extends along the first scan line GCL-N. The second linear portion 21b of the semiconductor film 21 extends along the second scan line GCL-P.

As illustrated in FIG. 4, the first linear portion 21a of the semiconductor film 21 intersects the first gate electrode GCL-Na and the first gate electrode GCL-Nb in the plan view, and the second linear portion 21b of the semiconductor film 21 intersects the second gate electrode GCL-Pa and the second gate electrode GCL-Pb in the plan view.

As illustrated in FIG. 6, the first NMOS transistor ntr1 is formed in a region where the first gate electrode GCL-Na intersects the first linear portion 21a in the plan view, and the second NMOS transistor ntr2 is formed in a region where the first gate electrode GCL-Nb intersects the first linear portion 21a in the plan view.

In the same way, the first PMOS transistor ptr1 is formed in a region where the second gate electrode GCL-Pa intersects the second linear portion 21b in the plan view, and the second PMOS transistor ptr2 is formed in a region where the second gate electrode GCL-Pb intersects the second linear portion 21b in the plan view.

The interlayer insulating film 23 covers the semiconductor film 21. The interlayer insulating film 23 is an inorganic insulating film, such as a silicon oxide film or a silicon nitride film. For example, the interlayer insulating film 23 may be laminated with the silicon oxide film, the silicon nitride film, and the silicon oxide film in this order from the base material 1 side. The interlayer insulating film 23 is provided with a second contact hole H2, a third contact hole H3, and a fourth contact hole H4. The second contact hole H2, the third contact hole H3, and the fourth contact hole H4 are through-holes each with the semiconductor film 21 serving as a bottom surface thereof.

As illustrated in FIGS. 4 and 9, the first linear portion 21a of the semiconductor film 21 is coupled to the signal line SGL through the third contact hole H3. As illustrated in FIGS. 4 and 7, the second linear portion 21b of the semiconductor film 21 is coupled to the signal line SGL through the fourth contact hole H4.

As illustrated in FIGS. 7, 8, and 9, the signal line SGL and a pedestal electrode 31 are provided on the interlayer insulating film 23. That is, the signal line SGL and the pedestal electrode 31 are provided in the same layer.

The signal line SGL and the pedestal electrode 31 contain a metal material, such as titanium or aluminum. For example, the signal line SGL and the pedestal electrode 31 may each be laminated with titanium, aluminum, and titanium in this order from the base material 1 side.

Two portions of the signal line SGL where the metal material is buried in the third contact hole H3 and the fourth contact hole H4 and the periphery thereof serves as the source of the pixel transistor TR. The pedestal electrode 31 is disposed at a location away from the signal line SGL. The metal material of the pedestal electrode 31 is buried in the second contact hole H2. The signal line SGL and the pedestal electrode 31 are made of, for example, conductive metals having the same composition. The pedestal electrode 31 can be called a drain electrode.

As illustrated in FIG. 4, the shape in the plan view of the pedestal electrode 31 is a linear shape extending in the Y-direction. The second contact hole H2 is located at a central portion in the X-direction of the pedestal electrode 31.

As illustrated in FIGS. 7, 8, and 9, the array substrate 100 includes an insulating planarizing film 33 provided on the interlayer insulating film 23. The planarizing film 33 is formed of, for example, an organic insulating film of, for example, an acrylic resin. As illustrated in FIG. 7, the planarizing film 33 is provided with a through-hole H11. The pedestal electrode 31 serves as a bottom surface of the through-hole H11.

As illustrated in FIG. 7, the array substrate 100 includes the common electrode 41 provided on the planarizing film 33 and an insulating film 45 provided on the common electrode 41. The common electrode 41 is made of indium tin oxide (ITO) to serve as a light-transmitting conductive film. The insulating film 45 is, for example, an inorganic insulating film, such as an aluminum oxide film, a silicon oxide film, or a silicon nitride film.

The insulating film 45 covers the common electrode 41. The insulating film 45 serves as a dielectric material of the first retention capacitance C1 (refer to FIG. 2). As illustrated in FIG. 7, the common electrode 41 is bored in a position overlapping with the through-hole H11. An inclined portion of the through-hole H11 is covered with the insulating film 45 to form a through-hole H12. The pedestal electrode 31 serves as a bottom surface of the through-hole H12.

As illustrated in FIGS. 8 and 7, the array substrate 100 also includes the pixel electrode 51 provided on the insulating film 45. The pixel electrode 51 is formed of a light-transmitting conductive material, such as ITO. The pixel electrode 51 may be formed of a light-reflective metal material, such as a monolayer of silver (Ag) or aluminum (Al), a multilayer including at least one of an Ag layer or an Al layer, and an alloy including Ag or Al. The pixel electrode 51 covers the common electrode 41 with the insulating film 45 interposed therebetween. As illustrated in FIG. 4, the through-hole H12 is provided in a position surrounded by the through-hole H11. The conductive material of the pixel electrode 51 is buried in the through-hole H12 to form a first contact hole H1. With this configuration, the pixel electrode 51 is coupled to the pedestal electrode 31 through the first contact hole H1.

As illustrated in FIG. 4, the shape in the plan view of the pixel electrode 51 is, for example, a rectangle. On the array substrate 100 illustrated in FIG. 3, the pixel electrodes 51 illustrated in FIG. 4 are arranged side by side in the X-direction and the Y-direction intersecting the X-direction, and are arranged in a two-dimensional matrix having a row-column configuration.

In the present embodiment, an area overlapping with each of the pixel electrodes 51 in the plan view serves as one of the pixels PX. A space is present between the pixel electrodes 51 adjacent to each other in the plan view. A center line (indicated by a long dashed short dashed line in FIG. 4) passing through the space and equidistant from the adjacent pixel electrodes 51 defines each of the pixels PX. This center line is a virtual line, and not an actually visible line.

The above-mentioned materials are mere examples. In the present embodiment, the portions of the array substrate 100 may be made of materials other than those mentioned above. For example, the first scan line GCL-N and the second scan line GCL-P may each be constituted by a film of aluminum, copper, silver, molybdenum, or an alloy thereof. The signal line SGL and the pedestal electrode 31 may be made of titanium aluminum, which is a titanium-aluminum alloy.

The following describes the structure of the display device 200 according to the first embodiment. FIG. 10 is a sectional view illustrating the display device 200 according to the first embodiment. As illustrated in FIG. 10, the display device 200 according to the first embodiment includes the above-described array substrate 100, the counter substrate 130 disposed so as to face the array substrate 100, the electrophoretic layer 160 disposed between the array substrate 100 and the counter substrate 130, and a seal portion 152.

The counter substrate 130 includes a base material 131 and the counter electrode 133. The base material 131 is a light-transmitting glass substrate, a light-transmitting resin substrate, or a light-transmitting resin film. The counter electrode 133 is provided on a surface of the base material 131 facing the array substrate 100. The counter electrode 133 is formed of ITO to serve as a light-transmitting conductive film. The counter electrode 133 and the pixel electrode 51 interpose the electrophoretic layer 160 therebetween.

The seal portion 152 is provided between the array substrate 100 and the counter substrate 130. The electrophoretic layer 160 is sealed in an internal space surrounded by the array substrate 100, the counter substrate 130, and the seal portion 152. The seal portion 152 is provided with a coupling member 153. The counter electrode 133 is coupled to the common electrode 41 of the array substrate 100 through the coupling member 153. With this configuration, the common potential VCOM is supplied to the counter electrode 133.

The electrophoretic layer 160 includes a plurality of microcapsules 163. A plurality of black fine particles 161, a plurality of white fine particles 162, and a dispersion liquid 165 are encapsulated in each of the microcapsules 163. The black fine particles 161 and the white fine particles 162 are dispersed in the dispersion liquid 165. The dispersion liquid 165 is a light-transmitting liquid, such as silicone oil. The black fine particles 161 are electrophoretic particles, and are made using, for example, negatively charged graphite. The white fine particles 162 are electrophoretic particles, and are made using, for example, a positively charged titanium oxide ($TiO_2$).

The dispersion states of the black fine particles 161 and the white fine particles 162 are changed by an electric field generated between the pixel electrode 51 and the counter electrode 133. The transmission state of light transmitted through the electrophoretic layer 160 changes with the dispersion states of the black fine particles 161 and the white fine particles 162. Thus, an image is displayed on a display surface. For example, when the common potential VCOM (of 0 V, for example) is supplied to the counter electrode 133 and a negative potential is supplied to the pixel electrode 51, the negatively charged black fine particles 161 move toward the counter substrate 130, and the positively charged white fine particles 162 move toward the array substrate 100. As a result, when the array substrate 100 is viewed from the counter substrate 130 side, an area (pixel) overlapping with the pixel electrode 51 in the plan view is displayed in black.

As described above, the array substrate 100 according to the first embodiment is provided with the first scan line GCL-N, the second scan line GCL-P, and the signal line SGL intersecting the first scan line GCL-N and the second scan line GCL-P in the plan view. The first scan line GCL-N and the second scan line GCL-P extend in the X-direction. The first gate electrode GCL-Na and the first gate electrode GCL-Nb are coupled to the first scan line GCL-N, and project in the Y-direction intersecting the X-direction from the first scan line GCL-N toward the second scan line GCL-P. The second gate electrode GCL-Pa and the second gate electrode GCL-Pb are coupled to the second scan line GCL-P, and project in the Y-direction from the second scan line GCL-P toward the first scan line GCL-N.

The semiconductor film 21 includes the first linear portion 21a extending in the X-direction, the second linear portion 21b extending in the X-direction, and the coupling portion 21c coupling the one end of the first linear portion 21a to the one end of the second linear portion 21b. That is, the semiconductor film 21 is U-shaped. The other end of the first linear portion 21a of the semiconductor film 21 and the other end of the second linear portion 21b of the semiconductor film 21 are coupled to the signal line SGL. The semiconductor film 21 is disposed between the first scan line GCL-N and the second scan line GCL-P in the plan view. The first linear portion 21a intersects the first gate electrode GCL-Na and the first gate electrode GCL-Nb, and the second linear portion 21b intersects the second gate electrode GCL-Pa and the second gate electrode GCL-Pb. This configuration allows the semiconductor film to be disposed even if the area surrounded by the first scan line GCL-N, the second scan line GCL-P, and the signal lines SGL is reduced. As a result, the array substrate 100 can provide a higher definition.

The first gate electrode GCL-Na and the second gate electrode GCL-Pa are arranged side by side in the Y-direction so as to be spaced from each other. The first gate electrode GCL-Nb and the second gate electrode GCL-Pb are arranged side by side in the Y-direction so as to be spaced from each other. With this arrangement, the coupling portion 21c of the semiconductor layer and the pedestal electrode 31 (drain electrode) are not disposed in positions overlapping with the first gate electrode GCL-Na, the first gate electrode GCL-Nb, the second gate electrode GCL-Pa, or the second gate electrode GCL-Pb in the plan view. As a result, parasitic capacitance can be reduced between each of the first gate electrode GCL-Na, the first gate electrode GCL-Nb, the second gate electrode GCL-Pa, and the second gate electrode GCL-Pb and the semiconductor film 21.

With this configuration, the pixel transistor TR of the array substrate 100 can have the complementary MOS (CMOS) configuration. The voltage amplitude applied to each of the NMOS transistor NTR and the PMOS transistor PTR of the array substrate 100 can be made smaller than in a case where the pixel transistor TR does not have the CMOS configuration. Withstand voltages of the PMOS transistor PTR and the NMOS transistor NTR constituting the pixel transistor TR of the array substrate 100 can be set lower.

The array substrate 100 according to the first embodiment includes the pedestal electrode 31 coupled to the semiconductor film 21, the planarizing film 33 covering the signal line SGL and the pedestal electrode 31, and the pixel electrode 51 disposed in each of the pixels PX. The first contact hole H1 electrically coupling the pedestal electrode 31 to the pixel electrode 51 is disposed between the first scan line GCL-N and the second scan line GCL-P in the plan view. With this configuration, the first contact hole H1 is provided on the pedestal electrode 31. As a result, the film forming accuracy of the pixel electrode 51 is improved.

The array substrate 100 according to the first embodiment also includes the interlayer insulating film 23 between the semiconductor film 21 and the pedestal electrode 31. The second contact hole H2 of the interlayer insulating film 23 electrically coupling the coupling portion 21c to the pedestal electrode 31 is disposed between the first scan line GCL-N and the second scan line GCL-P in the plan view. The pedestal electrode 31 blocks light between the first scan line GCL-N and the second scan line GCL-P in the plan view, and electrically couples the semiconductor film 21 to the pixel electrode 51.

As illustrated in FIG. 4, the first contact hole H1 and the second contact hole H2 are located in different positions. Accordingly, the second contact hole H2 has an accurate shape. As a result, the film forming accuracy of the pixel electrode 51 is improved.

The interlayer insulating film 23 is further provided with the third contact hole H3 coupling the linear portion 21a to the signal line SGL and the fourth contact hole H4 coupling the linear portion 21b to the signal line SGL.

The array substrate 100 further includes the insulating base material 1, the pixel electrode 51 provided on the one surface 1a side of the base material 1, and the pixel transistor TR provided between the base material 1 and the pixel electrode 51. The pixel transistor TR includes the NMOS transistor NTR and the PMOS transistor PTR coupled in parallel to the NMOS transistor NTR. The gate of the NMOS transistor NTR is coupled to the first scan line GCL-N. The source of the NMOS transistor NTR is coupled to the signal line SGL. The drain of the NMOS transistor NTR is coupled to the pixel electrode 51. The gate of the PMOS transistor PTR is coupled to the second scan line GCL-P. The source of the PMOS transistor PTR is coupled to the signal line SGL. The drain of the PMOS transistor PTR is coupled to the pixel electrode 51.

The display device 200 according to the first embodiment includes the above-described array substrate 100 and the display layer disposed so as to face the array substrate 100. The display layer is, for example, the electrophoretic layer 160. As a result, the present embodiment can provide an electrophoretic device capable of improving the display performance as the display device 200.

In the above-described first embodiment, the description has been made that each of the NMOS transistor NTR and the PMOS transistor PTR included in the pixel transistor TR is the bottom-gate transistor. In the present embodiment, however, each of the NMOS transistor NTR and the PMOS transistor PTR is not limited to the bottom-gate transistor. In the present embodiment, each of the NMOS transistor NTR and the PMOS transistor PTR may be a top-gate transistor. More specifically, in the top-gate NMOS transistor NTR or the top-gate PMOS transistor PTR, the semiconductor film 21 is disposed above the base material 1; the insulating film 13 is disposed above the semiconductor film 21; and the scan lines GCL are disposed above the insulating film 13. The interlayer insulating film 23 is further disposed above the scan lines GCL, and the signal line SGL is disposed above the interlayer insulating film 23. In this case, through-holes are formed in the insulating film 13 and the interlayer insulating film 23, and the second contact hole H2, the third contact hole H3, and the fourth contact hole H4 are coupled to the semiconductor film 21 through each of the through-holes formed in the insulating film 13 and the interlayer insulating film 23. An undercoat layer may be disposed between the base material 1 and the semiconductor film 21.

In the above-described first embodiment, the description has been made that the pixel electrode 51 and the common electrode 41 are each constituted by the light-transmitting conductive film. In the present embodiment, however, at least one of the pixel electrode 51 and the common electrode 41 may not be a light-transmitting conductive film and may be made of a metal, such as aluminum or silver. For example, if the pixel electrode 51 is made of the metal, the pixel electrode 51 can reflect incident light. If the common electrode 41 is made of the metal, the common electrode 41 can reflect the incident light toward the pixel electrode 51 side.

In the first embodiment, the description has been made that the display layer facing the array substrate 100 is the electrophoretic layer 160. In the present embodiment, however, the display layer is not limited to the electrophoretic layer 160. The display layer may be, for example, a liquid crystal layer. As a result, a liquid crystal display device with the improved display performance can be provided.

In the present embodiment, an insulating film may be provided on the pixel electrode 51. For example, if the display layer is the liquid crystal layer, an orientation film may be provided as the insulating film between the pixel electrode 51 and the liquid crystal layer. In the array substrate 100, this configuration allows liquid crystal molecules included in the liquid crystal layer to align in a certain direction.

Second Embodiment

Figure 11:
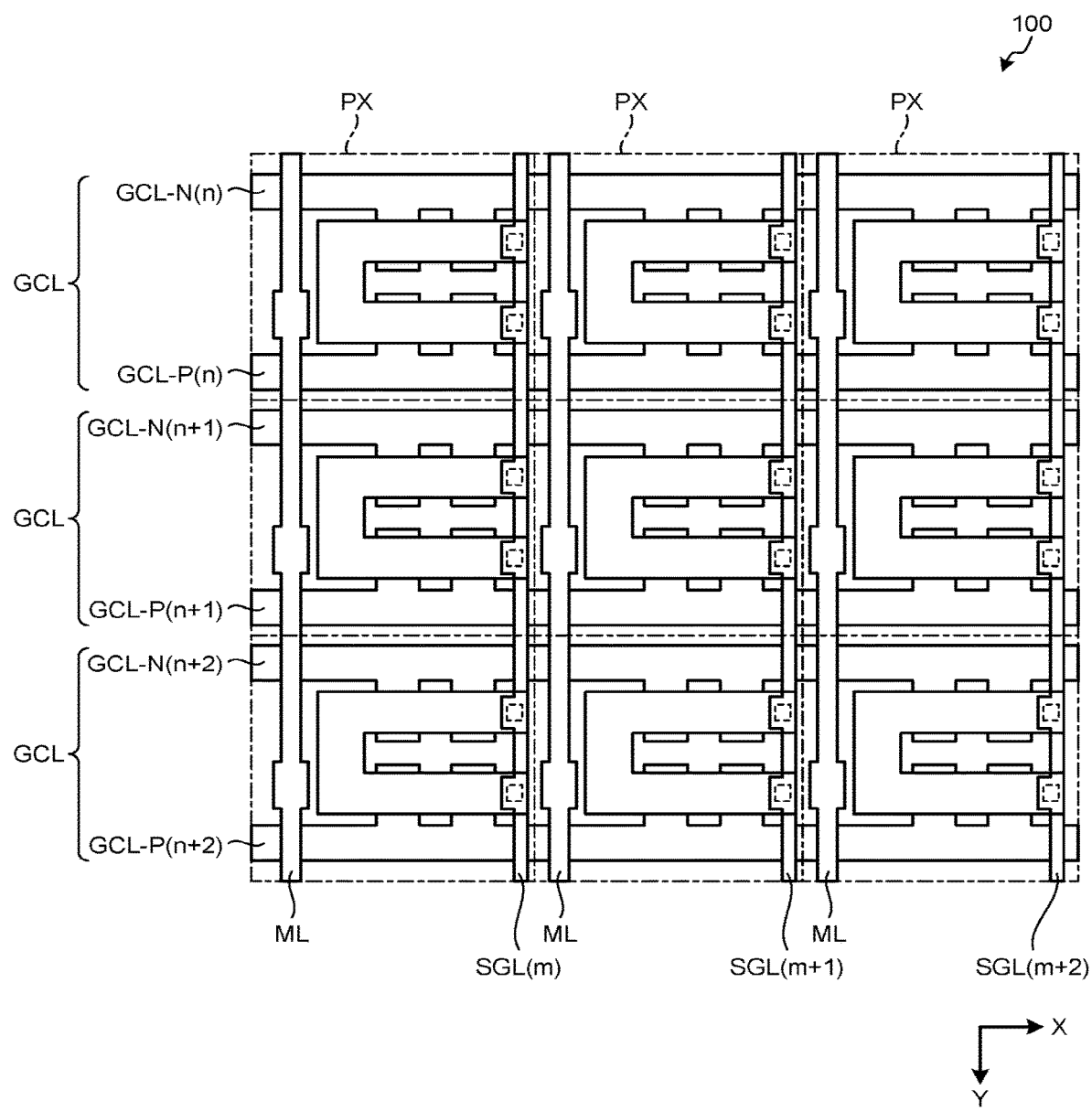
FIG. 11 is a plan view illustrating an arrangement example of the pixels on the array substrate according to a second embodiment of the present disclosure.
Figure 12:
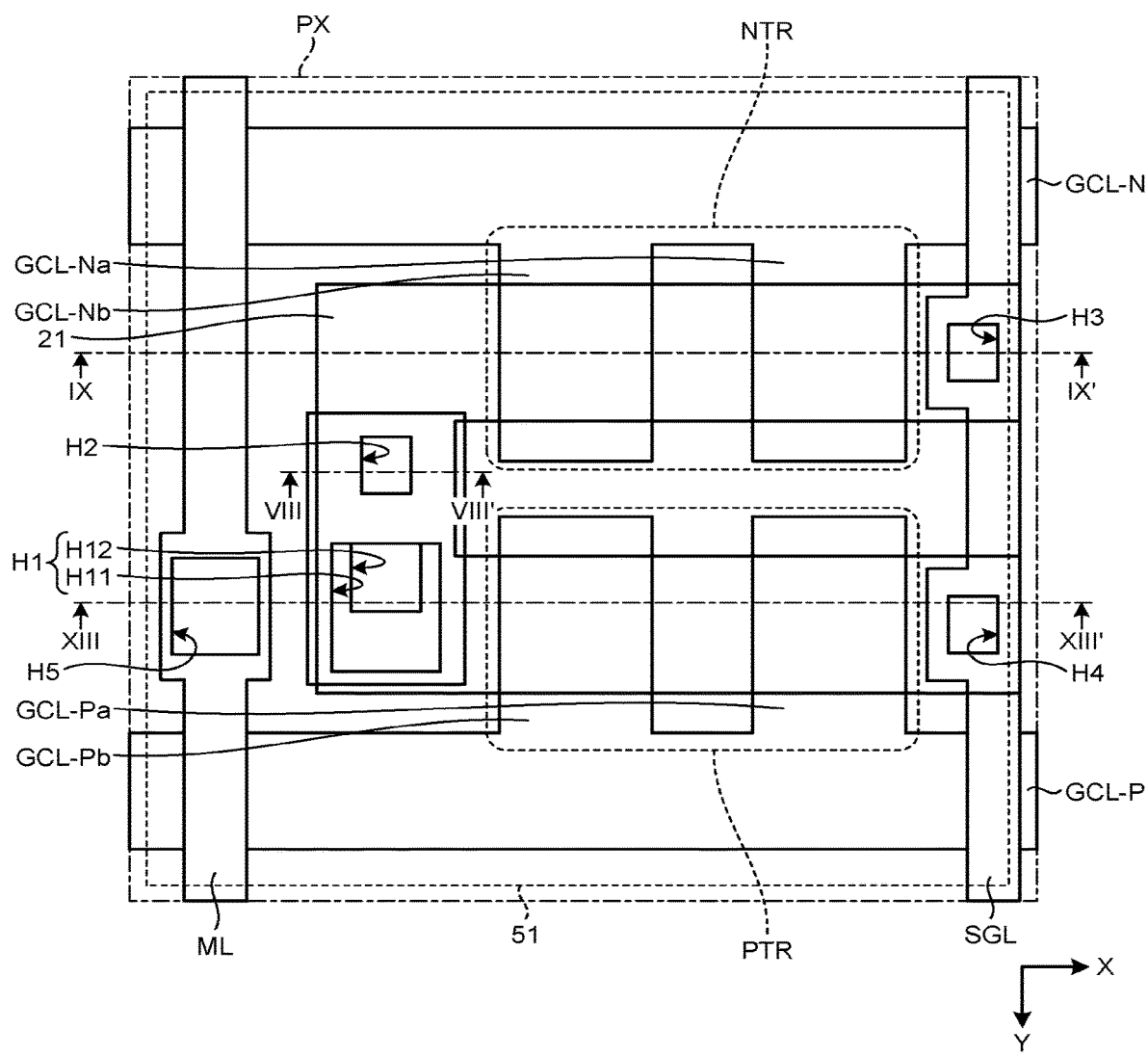
FIG. 12 is a circuit diagram illustrating one of the pixels on the array substrate according to the second embodiment.
Figure 13:
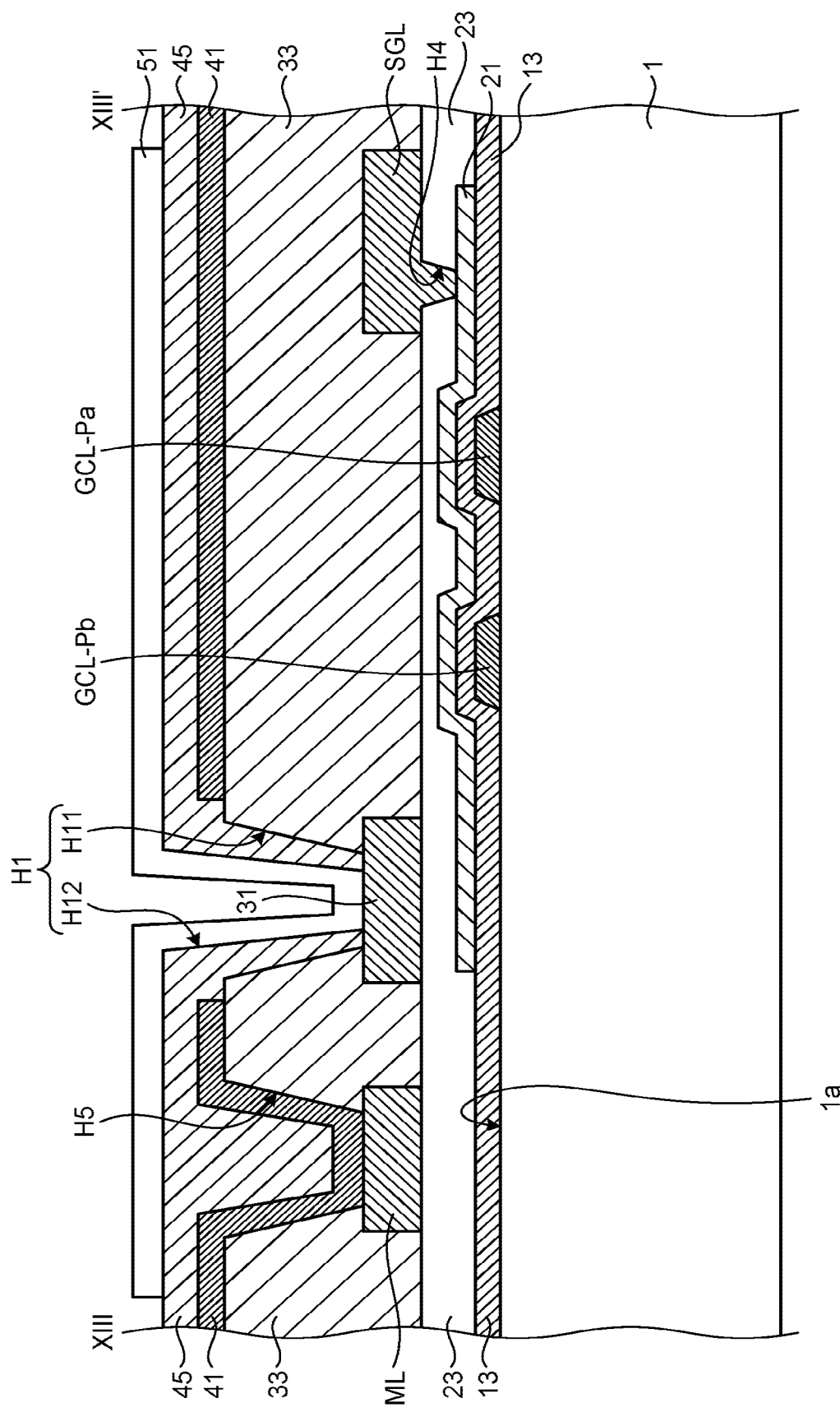
FIG. 13 is a sectional view along line XIII-XIII' illustrated in FIG. 12.

FIG. 11 is a plan view illustrating an arrangement example of the pixels on the array substrate according to a second embodiment of the present disclosure. FIG. 12 is a circuit diagram illustrating one of the pixels on the array substrate according to the second embodiment. FIG. 13 is a sectional view along line XIII-XIII' illustrated in FIG. 12. In the second embodiment, the same components as those in the first embodiment are denoted by the same reference numerals, and the description thereof will be omitted.

As illustrated in FIG. 11, the array substrate 100 according to the second embodiment includes auxiliary wiring ML extending in the Y-direction. In the second embodiment, one line of the auxiliary wiring ML is disposed in each of the pixels PX.

As illustrated in FIG. 13, the auxiliary wiring ML is disposed in a position not overlapping with any of the signal line SGL, the pedestal electrode 31, and the semiconductor film 21. While overlapping with the first scan line GCL-N and the second scan line GCL-P in the plan view, the auxiliary wiring ML is insulated therefrom by the insulating film 13.

As illustrated in FIG. 13, the auxiliary wiring ML is provided together with the signal line SGL and the pedestal electrode 31 on the interlayer insulating film 23. That is, the auxiliary wiring ML, the signal line SGL, and the pedestal electrode 31 are provided in the same layer. The auxiliary wiring ML is made of the same material as that of the signal line SGL and the pedestal electrode 31.

As illustrated in FIG. 13, the planarizing film 33 is provided with a fifth contact hole H5. The auxiliary wiring ML serves as a bottom surface of the fifth contact hole H5. As illustrated in FIG. 12, the auxiliary wiring ML overlapping with the fifth contact hole H5 is provided with a wide portion wider than other portions thereof. This configuration stabilizes the shape of the fifth contact hole H5.

The portion of the auxiliary wiring ML is shielded from light to reduce photoelectric conversion. This reduction of the photoelectric conversion allows the array substrate 100 to reduce possible malfunctions of the pixel transistor TR, which improves the reliability.

The contact hole H5 electrically couples the common electrode 41 to the auxiliary wiring ML, and is disposed between the first scan line GCL-N and the second scan line GCL-P in the plan view. This configuration can reduce the electrical resistance of the common electrode 41 even when the array substrate 100 is made finer.

Third Embodiment

Figure 14:
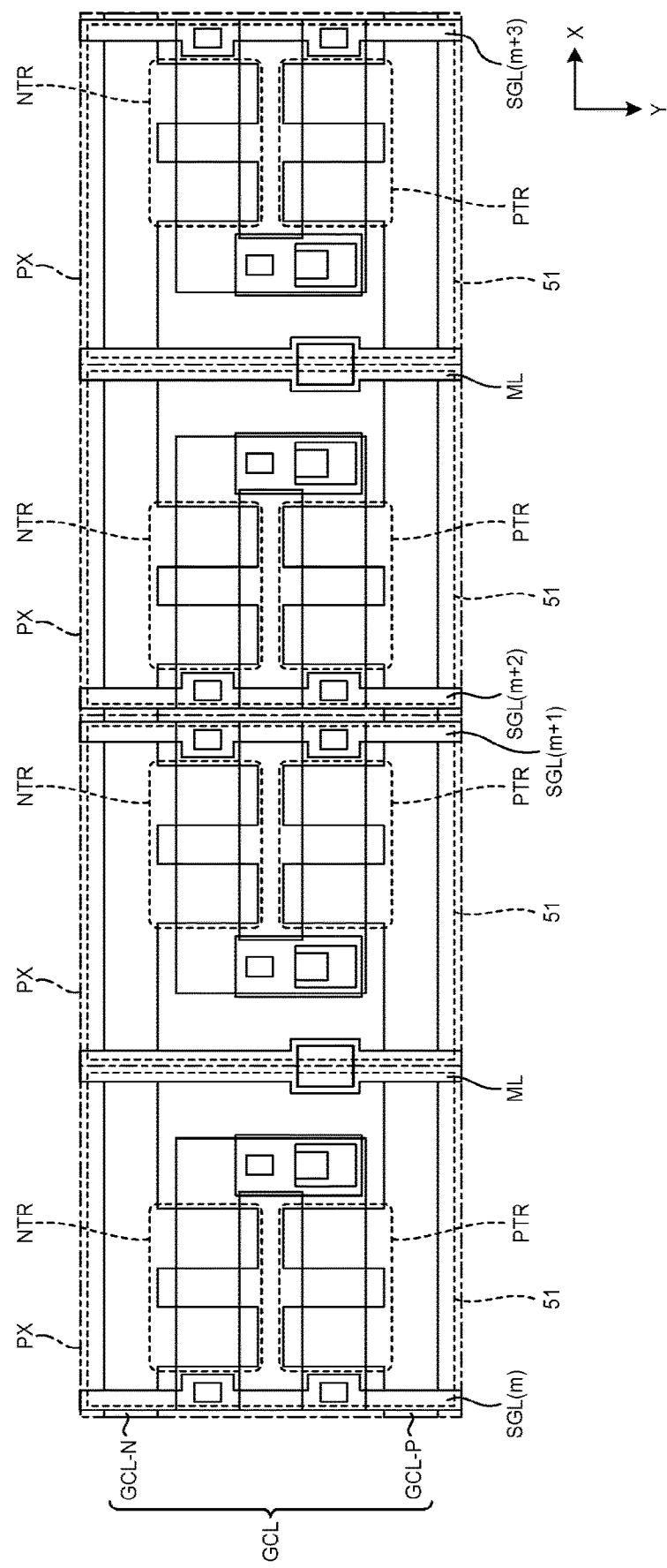
FIG. 14 is a plan view illustrating an arrangement example of the pixels on the array substrate according to a third embodiment of the present disclosure.

FIG. 14 is a plan view illustrating an arrangement example of the pixels on the array substrate according to a third embodiment of the present disclosure. In the third embodiment, the same components as those in either of the first embodiment or the second embodiment are denoted by the same reference numerals, and the description thereof will be omitted.

FIG. 14 illustrates four of the pixels PX arranged side by side in the X-direction. The auxiliary wiring ML illustrated in FIG. 14 is provided in every other position between the pixels PX arranged adjacent to each other in the X-direction. With this configuration, the semiconductor film 21 is formed into a line-symmetric shape with respect to the auxiliary wiring ML.

When the auxiliary wiring ML is not provided between the pixels PX arranged adjacent to each other in the X-direction, two of the signal lines SGL are arranged close to each other in the X-direction. In other words, two of the signal lines SGL are provided in every other position between the pixels PX arranged adjacent to each other in the X-direction.

This configuration makes the auxiliary wiring ML less visible even if the width of the auxiliary wiring ML is larger than that of the signal line SGL. Since the auxiliary wiring ML is provided in every other position between the pixels PX arranged adjacent to each other in the X-direction, the circuit scale occupying the pixels PX can be made smaller than that in the case of disposing the auxiliary wiring ML in each of the pixels PX. In addition, since the number of the lines of the auxiliary wiring ML decreases, the size in the X-direction of the pixel PX is reduced to enable the higher-definition display.

The preferred embodiments of the present disclosure have been described above. The present disclosure is, however, not limited to the embodiments described above. The contents disclosed in the embodiments are merely examples, and can be variously modified within the scope not departing from the gist of the present disclosure. Any modifications appropriately made within the scope not departing from the gist of the present disclosure also naturally belong to the technical scope of the present disclosure.

What is claimed is:

1. An array substrate comprising:
a first scan line extending in a first direction;
a second scan line extending in the first direction;
two first gate electrodes coupled to the first scan line and projecting in a second direction intersecting the first direction from the first scan line toward the second scan line;
two second gate electrodes coupled to the second scan line and projecting in the second direction from the second scan line toward the first scan line;
a signal line intersecting the first scan line and the second scan line in a plan view;
a semiconductor film having a first linear portion extending in the first direction, a second linear portion extending in the first direction, and a coupling portion coupling one end of the first linear portion to one end of the second linear portion, with another end of the first linear portion and another end of the second linear portion being coupled to the signal line,
a pedestal electrode coupled to the semiconductor film;
a planarizing film covering the signal line and the pedestal electrode;
a pixel electrode disposed in each pixel;
an interlayer insulating film between the semiconductor film and the pedestal electrode;
a first contact hole of the planarizing film, the first contact hole coupling the pedestal electrode to the pixel electrode and being disposed between the first scan line and the second scan line in the plan view;
a second contact hole of the interlayer insulating film, the second contact hole coupling the coupling portion to the pedestal electrode and being disposed between the first scan line and the second scan line in the plan view;
a third contact hole of the interlayer insulating film, the third contact hole coupling the first linear portion to the signal line; and
a fourth contact hole of the interlayer insulating film, the fourth contact hole coupling the second linear portion to the signal line,
wherein
in the plan view, the semiconductor film is disposed between the first scan line and the second scan line, the first linear portion intersects the two first gate electrodes, and the second linear portion intersects the two second gate electrodes.

2. The array substrate according to claim 1, wherein one of the first gate electrodes and one of the second gate electrodes are arranged side by side in the second direction so as to be spaced from each other.

3. The array substrate according to claim 1, further comprising:
a common electrode stacked on the pixel electrode with an insulating film interposed therebetween; and
auxiliary wiring coupled to the common electrode, wherein
the auxiliary wiring extends in the second direction, and
a fifth contact hole coupling the common electrode to the auxiliary wiring is disposed between the first scan line and the second scan line in the plan view.

4. The array substrate according to claim 3, wherein the auxiliary wiring is disposed in each pixel.

5. The array substrate according to claim 3, wherein the auxiliary wiring is provided in every other position between the pixels arranged adjacent to each other in the first direction.

6. The array substrate according to claim 1, comprising:
an n-channel metal-oxide semiconductor (NMOS) transistor; and
a p-channel metal-oxide semiconductor (PMOS) transistor coupled in parallel to the NMOS transistor, wherein
the first gate electrodes of the NMOS transistor are coupled to the first scan line, and
the second gate electrodes of the PMOS transistor are coupled to the second scan line.

7. A display device comprising:
an array substrate;
a counter substrate; and
a display layer located between the array substrate and the counter substrate, wherein
the display layer is an electrophoretic layer,
the array substrate comprises:
a first scan line extending in a first direction;
a second scan line extending in the first direction;
two first gate electrodes coupled to the first scan line and projecting in a second direction intersecting the first direction from the first scan line toward the second scan line;
two second gate electrodes coupled to the second scan line and projecting in the second direction from the second scan line toward the first scan line;
a signal line intersecting the first scan line and the second scan line in a plan view;
a semiconductor film having a first linear portion extending in the first direction, a second linear portion extending in the first direction, and a coupling portion coupling one end of the first linear portion to one end of the second linear portion, with another end of the first linear portion and another end of the second linear portion being coupled to the signal line;
a pedestal electrode coupled to the semiconductor film;
a planarizing film covering the signal line and the pedestal electrode;
a pixel electrode disposed in each pixel;
an interlayer insulating film between the semiconductor film and the pedestal electrode;
a first contact hole of the planarizing film, the first contact hole coupling the pedestal electrode to the pixel electrode and being disposed between the first scan line and the second scan line in the plan view;
a second contact hole of the interlayer insulating film, the second contact hole coupling the coupling portion to the pedestal electrode and being disposed between the first scan line and the second scan line in the plan view;
a third contact hole of the interlayer insulating film, the third contact hole coupling the first linear portion to the signal line; and
a fourth contact hole of the interlayer insulating film, the fourth contact hole coupling the second linear portion to the signal line, and
in the plan view, the semiconductor film is disposed between the first scan line and the second scan line, the first linear portion intersects the two first gate electrodes, and the second linear portion intersects the two second gate electrodes.

8. The display device according to claim 7, wherein one of the first gate electrodes and one of the second gate electrodes are arranged side by side in the second direction so as to be spaced from each other.

9. The display device according to claim 7, further comprising:
- a common electrode stacked on the pixel electrode with an insulating film interposed, therebetween; and
- auxiliary wiring coupled to the common electrode, wherein
- the auxiliary wiring extends in the second direction, and
- a fifth contact hole coupling the common electrode to the auxiliary wiring is disposed between the first scan line and the second scan line in the plan view.

10. The display device according to claim 9, wherein the auxiliary wiring is disposed in each pixel.

11. The display device according to claim 9, wherein the auxiliary wiring is provided in every other position between the pixels arranged adjacent to each other in the first direction.

12. The display device according to claim 7, comprising:
- an n-channel metal-oxide semiconductor (NMOS) transistor; and
- a p-channel metal-oxide semiconductor (PMOS) transistor coupled in parallel to the NMOS transistor, wherein
- the first gate electrodes of the NMOS transistor are coupled to the first scan line, and
- the second gate electrodes of the PMOS transistor are coupled to the second scan line.

* * * * *